(12) United States Patent
Choi et al.

(10) Patent No.: US 12,312,484 B2
(45) Date of Patent: May 27, 2025

(54) ENCAPSULATING COMPOSITION

(71) Applicant: LG CHEM, LTD., Seoul (KR)

(72) Inventors: Kook Hyun Choi, Daejeon (KR); Joon Hyung Kim, Daejeon (KR); Ji Won Kwak, Daejeon (KR); Mi Lim Yu, Daejeon (KR); Yung Jong Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 996 days.

(21) Appl. No.: 17/292,633

(22) PCT Filed: Nov. 12, 2019

(86) PCT No.: PCT/KR2019/015327
§ 371 (c)(1),
(2) Date: May 10, 2021

(87) PCT Pub. No.: WO2020/101319
PCT Pub. Date: May 22, 2020

(65) Prior Publication Data
US 2022/0002569 A1 Jan. 6, 2022

(30) Foreign Application Priority Data
Nov. 12, 2018 (KR) .................... 10-2018-0138360

(51) Int. Cl.
| | | |
|---|---|---|
| C09D 11/00 | (2014.01) | |
| C08F 20/14 | (2006.01) | |
| C09D 11/36 | (2014.01) | |
| C09D 11/38 | (2014.01) | |
| H10K 50/84 | (2023.01) | |
| H10K 71/13 | (2023.01) | |

(52) U.S. Cl.
CPC .............. *C09D 11/38* (2013.01); *C08F 20/14* (2013.01); *C09D 11/36* (2013.01); *H10K 50/84* (2023.02); *H10K 71/135* (2023.02)

(58) Field of Classification Search
CPC ...... C09D 11/38; C09D 11/36; H10K 71/135; H10K 50/84; C08F 20/14
USPC ........................................... 106/31.01, 31.13
See application file for complete search history.

(56) References Cited

U.S. PATENT DOCUMENTS

2006/0223937 A1  10/2006  Herr et al.

FOREIGN PATENT DOCUMENTS

| JP | 10-25262 A | 1/1998 | |
|---|---|---|---|
| JP | 2004-352881 A | 12/2004 | |
| JP | 2008536968 A | 9/2008 | |
| JP | 2013-133440 A | 7/2013 | |
| JP | 2014196387 A | * 10/2014 | ............ C08F 220/18 |
| JP | 2017-75198 A | 4/2017 | |
| KR | 10-2013-0097489 A | 9/2013 | |

(Continued)

*Primary Examiner* — James E McDonough
(74) *Attorney, Agent, or Firm* — Bryan Cave Leighton Paisner LLP

(57) ABSTRACT

The present disclosure relates to an encapsulating composition and an organic electronic device comprising the same, and provides an encapsulating composition which can effectively block moisture or oxygen introduced into an organic electronic device from the outside to secure the lifetime of the organic electronic device, can implement a top-emitting organic electronic device, can be applied in an inkjet method and can provide a thin display having low dielectric constant characteristics.

19 Claims, 1 Drawing Sheet

(56) References Cited

FOREIGN PATENT DOCUMENTS

| | | | |
|---|---|---|---|
| KR | 101742425 B1 * | 5/2017 | |
| KR | 10-2018-0098500 A | 9/2018 | |
| WO | 2006/107802 A1 | 10/2006 | |
| WO | 2015129579 A1 | 9/2015 | |

* cited by examiner

[Figure 1]
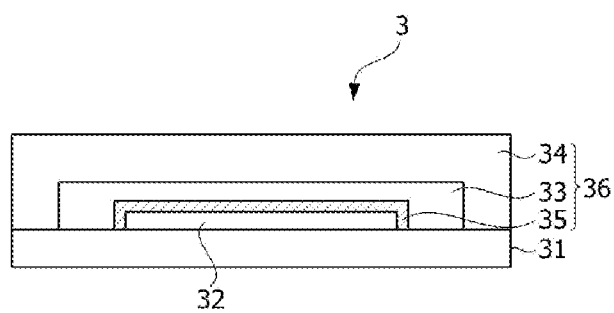
[Figure 2]
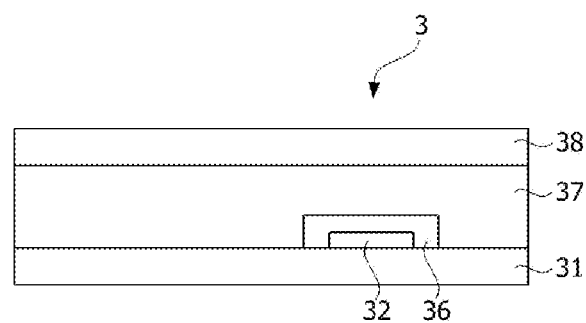

ENCAPSULATING COMPOSITION

CROSS-REFERENCE TO RELATED APPLICATIONS

This application is a National Phase entry pursuant to 35 U.S.C. § 371 of International Application No. PCT/KR2019/015327, filed Nov. 12, 2019, and claims the benefit of and priority to Korean Patent Application No. 10-2018-0138360, filed on Nov. 12, 2018, all of which are hereby incorporated by reference in their entirety for all purposes as if fully set forth herein.

TECHNICAL FIELD

The present application relates to an encapsulating composition, an organic electronic device comprising the same, and a method for manufacturing the organic electronic device.

BACKGROUND ART

An organic electronic device (OED) means a device comprising a layer of an organic material that generates an alternating current of electric charges using holes and electrons, and an example thereof may include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides an encapsulating composition which can effectively block moisture or oxygen introduced into an organic electronic device from the outside to secure the lifetime of the organic electronic device, can implement a top-emitting organic electronic device, can be applied in an inkjet method and can provide a thin display having low dielectric constant characteristics, and an organic electronic device comprising the same.

Technical Solution

The present application relates to an encapsulating composition. The encapsulating composition can be a sealing material applied to sealing or encapsulating an organic electronic device such as, for example, an OLED. In one example, the encapsulating composition of the present application can be applied to sealing or encapsulating the entire surface of an organic electronic element. Thus, after the encapsulating composition is applied to the encapsulation, it can be present in an organic layer form sealing the entire surface of the organic electronic element. In addition, the organic layer can be laminated on the organic electronic element together with a protective layer and/or an inorganic layer, which is described below, to form a encapsulating structure.

In an embodiment of the present application, the present application relates to an encapsulating composition for encapsulating an organic electronic element applicable to an inkjet process, where the composition can be designed to have appropriate physical properties, when it has been discharged onto a substrate by using inkjet printing capable of non-contact type patterning.

In this specification, the term "organic electronic device" means an article or device having a structure comprising an organic material layer that generates an alternating current of electric charges using holes and electrons between a pair of electrodes facing each other, and an example thereof can include a photovoltaic device, a rectifier, a transmitter and an organic light emitting diode (OLED), and the like, but is not limited thereto. In one example of the present application, the organic electronic device can be an OLED.

An exemplary encapsulating composition can comprise a multifunctional monomer of Formula 1 below and a monofunctional monomer.

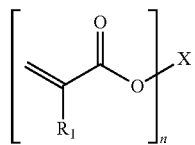

[Formula 1]

In Formula 1, $R_1$ is hydrogen or an alkyl group having 1 to 4 carbon atoms, n is a number of 2 to 10, and X represents a residue derived from a cyclic alkyl group having 6 to 30 carbon atoms, where X contains two or less oxygen atoms. Here, $R_1$ can be hydrogen or an alkyl group having 1 to 2 carbon atoms, and in an embodiment, it can be a methyl group. Also, n can be an integer of 2 to 8 or 2 to 4. Furthermore, X can be a residue derived from a cyclic alkyl group having 6 to 28 carbon atoms, 8 to 22 carbon atoms, or 12 to 20 carbon atoms. In one example, X can have a bicyclic or tricyclic structure. That is, X can have 2 to 3 rings in the cyclic structure. In addition, X can have an alicyclic structure. In addition, X can contain 2 or less oxygen atoms, where the lower limit can be 0 or 1. That is, X can contain no oxygen.

In this specification, the term "residue derived from an alkyl group" is a residue of a specific compound, which can mean one composed of an alkyl group. In one example, when n in Formula 1 above is 2, X can be an alkylene group. In addition, when n is 3 or more, X, in which two or more hydrogens of the alkyl group are eliminated, can be bonded to the (meth)acryloyl group of Formula 1 above.

In this specification, the term "alkyl group" can mean an alkyl group having 1 to 30 carbon atoms, 1 to 25 carbon atoms, 1 to 20 carbon atoms, 1 to 16 carbon atoms, 1 to 12 carbon atoms, 1 to 8 carbon atoms or 1 to 4 carbon atoms, unless otherwise specified. The alkyl group can have a linear, branched or cyclic structure, which can be optionally substituted by one or more substituents.

In this specification, the term "alkylene group" can mean an alkylene group having 2 to 30 carbon atoms, 2 to 25 carbon atoms, 2 to 20 carbon atoms, 2 to 16 carbon atoms, 2 to 12 carbon atoms, 2 to 10 carbon atoms or 2 to 8 carbon atoms, unless otherwise specified. The alkylene group can have a linear, branched or cyclic structure, which can be optionally substituted by one or more substituents.

The multifunctionality can mean that two or more (meth) acryloyl groups of Formula 1 above are included, and the monofunctionality can mean that one (meth)acryloyl group is included. In one example, as long as the multifunctional monomer of Formula 1 above satisfies, the kind thereof is not particularly limited, but it can include tricyclodecane dimethanol di(meth)acrylate or adamantane di(meth)acrylate.

The multifunctional monomer of Formula 1 above can be included in a range of 50 wt % or less in the total composition. In one embodiment, the upper limit of the content can be, for example, 45 wt %, 40 wt %, 38 wt %, 35 wt % or 33 wt % or less, and the lower limit can be, for example, 18 wt %, 20 wt %, 23 wt %, 25 wt % or 28 wt % or more.

In an embodiment of the present application, the monofunctional monomer can include an alkyl (meth)acrylate. In one embodiment, the monofunctional monomer can include an alkyl (meth)acrylate containing a linear, branched or cyclic alkyl group having 8 to 30, 9 to 28 or 10 to 20 carbon atoms.

The alkyl (meth)acrylate can include, for example, isodecyl (meth)acrylate or 4-(1,1-dimethylethyl)cyclohexyl acrylate, which can be used alone or in combination of two or more.

The monofunctional monomer can be included in a range of 80 to 230 parts by weight, 85 to 225 parts by weight, 90 to 220 parts by weight or 95 to 210 parts by weight relative to 100 parts by weight of the multifunctional monomer of Formula 1. The upper limit of the content can be 200 parts by weight or less, 180 parts by weight or less, 150 parts by weight or less, or 120 parts by weight or less, and the lower limit can be 100 parts by weight or more, 130 parts by weight or more, 150 parts by weight or more, 180 parts by weight or more, or 190 parts by weight or more.

The present application can adjust the dielectric constant low to effectively prevent the interference between circuits, as well as form the organic layer of the thin layer, through the composition formulation of the encapsulating composition. Generally, for lowering the dielectric constant, there are various methods in similar industries, but these are independent of implementing inkjetting properties. By maintaining the inkjetting properties, it is a technical problem of the present application to implement the low dielectric constant and moisture barrier characteristics while having good low viscosity spreadability and satisfying excellent curing sensitivity after curing.

In an embodiment of the present application, the encapsulating composition can further comprise a multifunctional monomer of Formula 2 below.

[Formula 2]

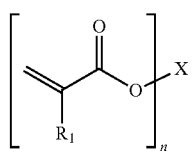

In Formula 2, $R_1$ is hydrogen or an alkyl group having 1 to 4 carbon atoms, n is a number of 2 to 10, and X represents a residue derived from a linear or branched alkyl group having 11 to 30 carbon atoms, where X contains two or less oxygen atoms. $R_1$ and n in Formula 2 above can be the same as the content of Formula 1 as described above. On the other hand, in Formula 2 above, X can be a residue derived from a linear alkyl group having 11 to 30, 12 to 30 or 13 to 30 carbon atoms, or 14 to 25 carbon atoms. In another example, X in Formula 2 above can be a residue derived from a branched alkyl group having 11 to 30, 12 to 30 or 13 to 30 carbon atoms, or 14 to 25 carbon atoms. In addition, X can contain two or less oxygen atoms, and the lower limit thereof can be 0 or 1. That is, X may not contain oxygen. As long as the multifunctional monomer of Formula 2 above satisfies the structure of Formula 2 above, the kind thereof is not particularly limited, but it can include, for example, 1,14-tetradecanediol di(meth)acrylate.

The multifunctional monomer of Formula 2 above can be included in the range of 50 to 140 parts by weight, 55 to 130 parts by weight, 58 to 120 parts by weight, 62 to 110 parts by weight or 65 to 105 parts by weight relative to 100 parts by weight of the multifunctional monomer of Formula 1. In an embodiment, the lower limit of the content can be 70 parts by weight, 80 parts by weight, 90 parts by weight or 95 parts by weight or more, and the upper limit can be 100 parts by weight, or 80 parts by weight. The multifunctional monomer of Formula 2 above can be distinguished from the multifunctional monomer of Formula 1 above in that there is no ring structure in the molecular structure. By adjusting the encapsulating composition to the composition formulation, the present application can implement application properties when the encapsulating composition is applied by inkjetting, the curing properties after curing and the low dielectric constant properties.

In an embodiment of the present application, after the encapsulating composition is cured into a thin layer having a thickness of 20 μm or less, it can have a dielectric constant of less than 3.2, less than 3.1, less than 3.0, less than 2.9, less than 2.85, 2.83 or less, 2.8 or less, 2.78 or less, 2.75 or less, or 2.74 or less under conditions of 100 kHz to 400 kHz and 25° C. The lower limit of the dielectric constant is not particularly limited, which can be 0.01 or 0.1. In general, the dielectric constant decreases as the thickness increases, but the present application can have the dielectric constant range even though the thickness of the thin layer is 20 μm or less. The lower limit of the thickness can be, for example, 1 μm or 3 μm, where the encapsulating composition of the present application can have a dielectric constant range of the present application even if it is cured to the thickness range of the lower limit, and the encapsulating composition of the present application can minimize product defects such as circuit interference after curing.

In an embodiment of the present application, the encapsulating composition can further comprise a crosslinking agent. The crosslinking agent is not particularly limited, but it can be a multifunctional acrylate. In addition, the crosslinking agent can include, for example, 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-dimethanol di(meth)acrylate, dimethylol dicyclopentane di(meth)acrylate, neopentyl glycol modified trimethylpropane di(meth)acrylate, trimethylolpropane tri (meth)acrylate or a mixture thereof.

In one example, the crosslinking agent can satisfy, for example, a case where in Formula 2 as described above, X is a residue derived from a linear or branched alkyl group having 1 to 10 or 3 to 8 carbon atoms. Also, when X is a residue derived from a cyclic alkyl group, X may not have a bicyclic or tricyclic structure, and can have one cyclic structure. In addition, X optionally contains oxygen. The crosslinking agent can have, for example, bifunctionality or more, and for example, can have trifunctionallity or more and hexafunctionality or less.

In this specification, the term "residue derived from an alkyl group" is a residue of a specific compound, which can mean one composed of an alkyl group. In one example, when n in Formula 1 or 2 above is 2, X can be an alkylene group. In addition, when n is 3 or more, X, in which two or more hydrogens of the alkyl group are eliminated, can be bonded to the (meth)acryloyl group of Formula 1 or 2 above.

The crosslinking agent can be included in the range of 10 to 70 parts by weight, 12 to 67 parts by weight, 15 to 63 parts by weight or 18 to 58 parts by weight relative to 100 parts by weight of the multifunctional monomer of Formula 1. In an embodiment, the lower limit of the content can be, for example, 25 parts by weight or 30 parts by weight or more, and the upper limit can be, for example, 55 parts by weight or 50 parts by weight or less. In this specification, the term "part by weight" can mean a weight ratio between the respective components. The present application can provide a cured product of the encapsulating composition having the desired physical properties within the above content range.

Through the specific composition formulation of the encapsulating composition, the present application can form an organic layer on an organic electronic element by an inkjet method, where the applied encapsulating composition can provide an organic layer having excellent spreadability in a short time and having excellent curing sensitivity after curing. When the curing sensitivity is insufficient, the uncured powder occurs or the out-gas occurs in the composition, which results in serious endurance reliability problems due to the properties of the encapsulating compositions of the present application applied directly on organic electronic elements. In addition, the encapsulating composition can implement excellent adhesive strength and low dielectric constant characteristics together with processability as an ink composition.

In this specification, the term "monomer" can refer to a compound having a weight average molecular weight in a range of 150 to 1,000 g/mol, 173 to 980 g/mol, 188 to 860 g/mol, 210 to 823 g/mol or 330 to 780 g/mol. By controlling the weight average molecular weight of the monomers included in the encapsulating composition to be low, the present application can prevent the viscosity of the composition from becoming too high to make the inkjet process impossible, while improving the degree of curing completion after curing of the encapsulating composition and simultaneously provide moisture barrier property and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time. In this specification, the epoxy equivalent is also grams (g/eq) of the resin containing one gram equivalent of an epoxy group, which can be measured according to the method defined in JIS K 7236.

In an embodiment of the present application, the encapsulating composition can further comprise a photoinitiator. As the photoinitiator, the present application can use a radical photoinitiator.

A specific type of the photoinitiator can be appropriately selected in consideration of a curing rate and yellowing possibility, and the like. For example, a benzoin-based, hydroxyketone-based, aminoketone-based or phosphine oxide-based photoinitiator can be used, and in particular, benzoin, benzoin methyl ether, benzoin ethyl ether, benzoin isopropyl ether, benzoin n-butyl ether, benzoin isobutyl ether, acetophenone, dimethyl amino acetophenone, 2,2-dimethoxy-2-phenylacetophenone, 2,2-diethoxy-2-phenylacetophenone, 2-hydroxy-2-methyl-1-phenylpropane-1one, 1-hydroxycyclohexyl phenylketone, 2-methyl-1-[4-(methylthio)phenyl]-2-morpholino-propan-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The photoinitiator can be included in a range of 0.1 to 10 wt %, 0.5 to 8 wt %, 1 to 5 wt %, 1.5 to 4.5 wt % or 2 to 3.8 wt % in the total composition. The present application can effectively induce a crosslinking or curing reaction of the encapsulating composition through this, and also prevent the physical properties of the encapsulating composition from deteriorating due to the remaining components after curing.

In an embodiment of the present application, the encapsulating composition can further comprise a surfactant. In one example, the surfactant can be a nonpolar compound without any polar functional group. In one example, the surfactant can include a silicone-based surfactant. By using the surfactant, it is possible to provide an organic thin layer having low dielectric constant characteristics of the thin layer together with inkjetting processability.

The surfactant can be included in a range of 0.1 to 10 wt %, 0.3 to 8 wt %, 0.5 to 5 wt %, 0.7 to 4.5 wt % or 0.8 to 3.8 wt % in the total composition.

The encapsulating composition of the present application can comprise a moisture adsorbent as necessary. The term "moisture adsorbent" can be used to generically mean a component capable of adsorbing or removing moisture or humidity introduced from the outside through a physical or chemical reaction or the like. That is, it means a moisture reactive adsorbent or a physical adsorbent, and a mixture thereof is also usable.

A specific kind of the usable moisture adsorbent in the present application is not particularly limited, which can include, for example, one or a mixture of two or more of a metal oxide, a metal salt or phosphorus pentoxide ($P_2O_5$), and the like, in the case of a moisture reactive adsorbent, and can include zeolite, zirconia or montmorillonite, and the like, in the case of the physical adsorbent.

The encapsulating composition of the present application can comprise a moisture adsorbent in an amount of 5 parts by weight to 100 parts by weight, 5 to 80 parts by weight, 5 parts by weight to 70 parts by weight or 10 to 30 parts by weight relative to 100 parts by weight of the total monomers included in the composition. As the encapsulating composition of the present application controls preferably the content of the moisture adsorbent to 5 parts by weight or more, the encapsulating composition or its cured product can be made to exhibit excellent moisture and humidity barrier properties. In addition, the present application can control the content of the moisture adsorbent to 100 parts by weight or less, to provide a encapsulating structure of the thin layer.

In one example, the encapsulating composition can further comprise an inorganic filler, if necessary. The specific type of the usable filler in the present application is not particularly limited, and for example, one or a mixture of two or more of clay, talc, alumina, calcium carbonate, silica, and the like can be used.

The encapsulating composition of the present application can comprise 0 parts by weight to 50 parts by weight, 1 part by weight to 40 parts by weight, 1 part by weight to 20 parts by weight, or 1 to 10 parts by weight of inorganic filler, relative to 100 parts by weight of the total monomers included in the composition. The present application can provide a encapsulating structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin layer.

In addition to the above-mentioned constitutions, the encapsulating composition according to the present application can comprise various additives in the range without affecting the above-described effects of invention. For example, the encapsulating composition can comprise a defoamer, a tackifier, an ultraviolet stabilizer or an antioxidant and the like in an appropriate range of content depending on the desired physical properties.

In one example, the encapsulating composition can be in a liquid phase at room temperature, for example, 15° C. to 35° C. or about 25° C. In an embodiment of the present application, the encapsulating composition can be in a solventless type liquid phase. The encapsulating composition can be applied to encapsulating an organic electronic element, and specifically, the encapsulating composition can be an ink composition that can be applied to encapsulating the entire surface of the organic electronic element. The encapsulating composition of the present application can have a specific composition and physical properties to be capable of ink-jetting.

Furthermore, in an embodiment of the present application, the encapsulating composition can have a viscosity in a range of 50 cPs or less, 1 to 46 cPs, 3 to 44 cPs, 4 to 38 cPs, 5 to 33 cPs or 14 to 24 cPs, as measured by Brookfield's DV-3 at a temperature of 25° C., a torque of 90% and a shear rate of 100 rpm. By controlling the viscosity of the composition within the above range, the present application can realize physical properties that ink-jetting can be performed and increase coating properties, at the time of being applied to an organic electronic element, to provide a sealing material of a thin layer.

In one example, the encapsulating composition can have a surface energy of the cured product after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

In an embodiment of the present application, the surface energy ($\gamma^{surface}$, mN/m) can be calculated as $\gamma^{surface}=\gamma^{dispersion}+\gamma^{polar}$. In one example, the surface energy can be measured using a drop shape analyzer (DSA100 product from KRUSS). For example, after an encapsulating composition for measuring the surface energy is applied on a SiNx substrate to a thickness of about 50 μm and a coating area of 4 cm² (width: 2 cm, height: 2 cm) to form a sealing layer (spin coater), it is dried at room temperature for about 10 minutes or so under a nitrogen atmosphere and then UV-cured with an intensity of 1000 mW/cm² through a light quantity of 4000 mJ/cm². The process of dropping the deionized water whose surface tension is known on the layer after curing, and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane.

In addition, in an embodiment of the present application, the encapsulating composition can have light transmittance of 90% or more, 92% or more or 95% or more in the visible light region after curing. The present application provides an organic electronic device having high resolution, low power consumption and a long life-span by applying an encapsulating composition to a top emission organic electronic device within the above range. In addition, the encapsulating composition of the present application can have haze according to JIS K7105 standard test of 3% or less, 2% or less, or 1% or less after curing, where the lower limit is not particularly limited, but it can be 0%. Within the haze range, the encapsulating composition can have excellent optical properties after curing. In this specification, the light transmittance or haze as described above can be measured in a state of curing the encapsulating composition to the organic layer, which can be an optical characteristic measured when the thickness of the organic layer is any one thickness of 2 to 20 μm. In an embodiment of the present application, the moisture adsorbent or inorganic filler as described above may not be included, in order to implement the optical characteristics.

The present application also relates to an organic electronic device. As shown in FIG. 1, an exemplary organic electronic device (3) can comprise a substrate (31); an organic electronic element (32) formed on the substrate (31); and an organic layer (33) encapsulating the entire surface of the organic electronic element (32) and containing the above-described encapsulating composition.

In an embodiment of the present application, the organic electronic element can comprise a first electrode layer, an organic layer formed on the first electrode layer and containing at least a light emitting layer, and a second electrode layer formed on the organic layer. The first electrode layer can be a transparent electrode layer or a reflective electrode layer, and the second electrode layer can also be a transparent electrode layer or a reflective electrode layer. More specifically, the organic electronic element can comprise a reflective electrode layer formed on a substrate, an organic layer formed on the reflective electrode layer and containing at least a light emitting layer, and a transparent electrode layer formed on the organic layer.

In the present application, the organic electronic element (32) can be an organic light emitting diode.

In one example, the organic electronic device according to the present application can be a top emission type, but is not limited thereto, and can be applied to a bottom emission type.

The organic electronic device can further comprise a protective layer (35) for protecting the electrodes and the light emitting layer of the organic electronic element. The protective layer (35) can be an inorganic protective layer. The protective layer can be a protective layer by chemical vapor deposition (CVD), where the material can be the same as or different from the following inorganic layer and a known inorganic material can be used. For example, as the protective layer, silicon nitride (SiNx) can be used. In one example, silicon nitride (SiNx) used as the protective layer can be deposited to a thickness of 0.01 µm to 50 µm.

In an embodiment of the present application, the organic electronic device (3) can further comprise an inorganic layer (34) formed on the organic layer (33). In one example, the inorganic layer can be one or more metal oxides, nitrides or oxynitrides selected from the group consisting of Al, Zr, Ti, Hf, Ta, In, Sn, Zn and Si. The inorganic layer can have a thickness of 0.01 µm to 50 µm, 0.1 µm to 20 µm, or 1 µm to 10 µm. In one example, the inorganic layer of the present application can be an inorganic material without any dopant, or can be an inorganic material containing a dopant. The dopant which can be doped can be one or more elements selected from the group consisting of Ga, Si, Ge, Al, Sn, Ge, B, In, Tl, Sc, V, Cr, Mn, Fe, Co and Ni, or an oxide of the element, but is not limited thereto.

In one example, the organic layer can have a thickness in a range of 2 µm to 20 µm, 2.5 µm to 15 µm, or 2.8 µm to 9 µm. The present application can provide a thin-film organic electronic device by providing a thin organic layer.

The organic electronic device (3) of the present application can comprise a encapsulating structure containing the organic layer (33) and the inorganic layer (34), as described above, where the encapsulating structure can comprise at least one or more organic layers and at least one or more inorganic layers, and the organic layer and the inorganic layer can be repeatedly laminated. For example, the organic electronic device can have a structure of substrate/organic electronic element/protective layer/(organic layer/inorganic layer)n, where n can be a number in a range of 1 to 100. FIG. 1 is a cross-sectional view exemplarily showing a case where n is 1.

In one example, the organic electronic device (3) of the present application can further comprise a cover substrate present on the organic layer (33). The material of the substrate and/or the cover substrate is not particularly limited, and a known material in the art can be used. For example, the substrate or the cover substrate can be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like can be used.

Also, as shown in FIG. 2, the organic electronic device (3) can further comprise a encapsulating film (37) existing between the cover substrate (38) and the substrate (31) on which the organic electronic element (32) is formed. The encapsulating film (37) can be applied as a use for attaching the substrate (31) on which the organic electronic element (32) is formed and the cover substrate (38), which can be, for example, a pressure-sensitive adhesive film or an adhesive film, but is not limited thereto. The encapsulating film (37) can seal the entire surface of the encapsulating structure (36) of the above-described organic layer and inorganic layer, laminated on the organic electronic element (32).

The present application also relates to a method for manufacturing an organic electronic device.

In one example, the manufacturing method can comprise a step of forming an organic layer (33) on a substrate (31), on which an organic electronic element (32) is formed, by applying the above-described encapsulating composition so as to encapsulate the entire surface of the organic electronic element (32).

Here, the organic electronic element (32) can be produced by forming a reflective electrode or a transparent electrode on a substrate (31) such as glass or a polymer film, as a substrate (31), by a method such as vacuum deposition or sputtering, and forming an organic material layer on the reflective electrode. The organic material layer can comprise a hole injecting layer, a hole transporting layer, a light emitting layer, an electron injecting layer, and/or an electron transporting layer. Subsequently, a second electrode is further formed on the organic material layer. The second electrode can be a transparent electrode or a reflective electrode.

The manufacturing method of the present application can further comprise a step of forming a protective layer (35) on the first electrode, the organic material layer and the second electrode, formed on the substrate (31). Then, the above-described organic layer (33) is applied to cover the entire surface of the organic electronic element (32) on the substrate (31). Here, the step of forming the organic layer (33) is not particularly limited and the above-described encapsulating composition can be applied to the entire surface of the substrate (31) using a process such as inkjet printing, gravure coating, spin coating, screen printing or reverse offset coating.

The manufacturing method can further comprise a step of irradiating the organic layer with light. In the present invention, a curing process can also be performed on an organic layer encapsulating an organic electronic device, and such a curing process can be performed, for example, in a heating chamber or a UV chamber, and preferably, can be performed in a UV chamber.

In one example, after the above-described encapsulating composition is applied to form a top side organic layer, the composition can be irradiated with light to induce crosslinking. The irradiation of light can comprise irradiating with light having a wavelength range of 250 nm to 450 nm or 300 nm to 450 nm region bands at a light quantity of 0.3 to 6 $J/cm^2$ or a light quantity of 0.5 to 5 $J/cm^2$.

In addition, the manufacturing method of the present application can further comprise a step of forming an inorganic layer (34) on the organic layer (33). As the step of forming an inorganic layer, a method known in the art can be used, and the inorganic layer can be formed by chemical vapor deposition (CVD), as described above.

Advantageous Effects

The present application provides an encapsulating composition which can effectively block moisture or oxygen introduced into an organic electronic device from the outside to secure the lifetime of the organic electronic device, can implement a top-emitting organic electronic device, can be applied in an inkjet method and can provide a thin display having low dielectric constant characteristics, and an organic electronic device comprising the same.

BRIEF DESCRIPTION OF DRAWINGS

FIGS. 1 and 2 are cross-sectional diagrams showing an organic electronic device according to one example of the present invention.

EXPLANATION OF REFERENCE NUMERALS

3: organic electronic device
31: substrate
32: organic electronic element
33: organic layer
34: inorganic layer
35: protective layer
36: encapsulating structure
37: encapsulating film
38: cover substrate

BEST MODE

Hereinafter, the present invention will be described in more detail through Examples according to the present invention and Comparative Examples not complying with the present invention, but the scope of the present invention is not limited by the following examples.

Example 1

At room temperature, tricyclodecane dimethanol diacrylate as a multifunctional monomer of Formula 1, 1,14-tetradecanediol dimethacrylate as a multifunctional monomer of Formula 2 and isodecyl acrylate as a monofunctional monomer were each introduced into a mixing container at a weight ratio (part by weight) of 30:30:30 (Formula 1:Formula 2:monofunctional monomer). In addition, 6 parts by weight of trimethylolpropane trimethacrylate as a crosslinking agent, 1 part by weight of a silicone-based surfactant (BYK399) and 3 parts by weight of a radical photoinitiator (TPO) were further introduced to the mixing vessel.

In the mixing vessel, a uniform encapsulating composition ink was prepared using a planetary mixer (Kurabo, KK-250s).

Example 2

At room temperature, tricyclodecane dimethanol diacrylate as a multifunctional monomer of Formula 1, and isodecyl acrylate and 4-(1,1-dimethylethyl)cyclohexyl acrylate as monofunctional monomers were each introduced into a mixing vessel at a weight ratio of 30:30:30 (Formula 1:isodecyl acrylate:4-(1,1-dimethylethyl)cyclohexyl acrylate). In addition, 6 parts by weight of trimethylolpropane trimethacrylate as a crosslinking agent, 1 part by weight of a silicone-based surfactant (BYK399) and 3 parts by weight of a radical photoinitiator (TPO) were further introduced to the mixing vessel.

In the mixing vessel, a uniform encapsulating composition ink was prepared using a planetary mixer (Kurabo, KK-250s).

Example 3

At room temperature, tricyclodecane dimethanol diacrylate as a multifunctional monomer of Formula 1, 1,14-tetradecanediol dimethacrylate as a multifunctional monomer of Formula 2 and isodecyl acrylate as a monofunctional monomer were each introduced into a mixing container at a weight ratio of 30:20:30 (Formula 1:Formula 2:monofunctional monomer). In addition, 16 parts by weight of trimethylolpropane trimethacrylate as a crosslinking agent, 1 part by weight of a silicone-based surfactant (BYK399) and 3 parts by weight of a radical photoinitiator (TPO) were further introduced to the mixing vessel.

In the mixing vessel, a uniform encapsulating composition ink was prepared using a planetary mixer (Kurabo, KK-250s).

Comparative Example 1

At room temperature, 1,10-decanediol dimethacrylate, trimethylolpropane trimethacrylate as a crosslinking agent, a silicone-based surfactant (BYK399) and a radical photoinitiator (TPO) were each introduced into a mixing vessel at a weight ratio of 90:6:1:3.

In the mixing vessel, a uniform encapsulating composition ink was prepared using a planetary mixer (Kurabo, KK-250s).

Comparative Example 2

At room temperature, 1,9-nonanediol diacrylate, trimethylolpropane trimethacrylate as a crosslinking agent, a silicone-based surfactant (BYK399) and a radical photoinitiator (TPO) were each introduced into a mixing vessel at a weight ratio of 90:6:1:3.

In the mixing vessel, a uniform encapsulating composition ink was prepared using a planetary mixer (Kurabo, KK-250s).

Comparative Example 3

At room temperature, stearyl acrylate, lauryl acrylate, trimethylolpropane trimethacrylate as a crosslinking agent, a silicone-based surfactant (BYK399) and a radical photoinitiator (TPO) were each introduced into a mixing vessel at a weight ratio of 40:46:10:1:3.

In the mixing vessel, a uniform encapsulating composition ink was prepared using a planetary mixer (Kurabo, KK-250s).

Comparative Example 4

At room temperature, 1,14-tetradecanediol dimethacrylate, trimethylolpropane trimethacrylate as a crosslinking agent, a silicone-based surfactant (BYK399) and a radical photoinitiator (TPO) were each introduced into a mixing vessel at a weight ratio of 90:6:1:3.

In the mixing vessel, a uniform encapsulating composition ink was prepared using a planetary mixer (Kurabo, KK-250s).

Comparative Example 5

At room temperature, 1,14-tetradecanediol dimethacrylate, trimethylolpropane trimethacrylate as a crosslinking agent, a silicone-based surfactant (BYK399) and a radical photoinitiator (TPO) were each introduced into a mixing vessel at a weight ratio of 10:86:1:3.

In the mixing vessel, a uniform encapsulating composition ink was prepared using a planetary mixer (Kurabo, KK-250s).

Comparative Example 6

At room temperature, tricyclodecane dimethanol diacrylate as a multifunctional monomer of Formula 1, stearyl acrylate, a silicone-based surfactant (BYK399) and a radical photoinitiator (TPO) were each introduced in a mixing vessel at a weight ratio of 80:16:1:3.

In the mixing vessel, a uniform encapsulating composition ink was prepared using a planetary mixer (Kurabo, KK-250s).

Comparative Example 7

At room temperature, tricyclodecane dimethanol diacrylate as a multifunctional monomer of Formula 1, 1,14-tetradecanediol dimethacrylate as a multifunctional monomer of Formula 2, a silicone-based surfactant (BYK399) and a radical photoinitiator (TPO) were each introduced into a mixing vessel at a weight ratio of 16:80:1:3.

In the mixing vessel, a uniform encapsulating composition ink was prepared using a planetary mixer (Kurabo, KK-250s).

Physical properties in Examples and Comparative Examples were evaluated in the following manners.

Upon evaluating the physical properties, if necessary, the encapsulating compositions prepared in Examples and Comparative Examples were each subjected to inkjetting as follows to form an organic layer.

The encapsulating compositions prepared in Examples and Comparative Examples were each subjected to inkjetting using Unijet UJ-200 (Inkjet head-Dimatix 10 pL 256) to form an organic layer.

Inkjet Conditions:
    Waveform—Var1: 2 μs, Main: 8 μs, Var2: 2 μs, Heating temperature: −45° C.
    Jetting Voltage—100V, Jetting Frequency—1000 Hz The printed organic layer was irradiated with UV having a wavelength range of 395 nm with an intensity of 1000 mW/cm² at 1000 mJ/cm² using an LED lamp, and cured.

1. Surface Energy Measurement

Surface energy of the encapsulating compositions prepared in Examples and Comparative Examples was measured using a drop shape analyzer (DSA100 product from KRUSS). A sealing layer is formed by applying the encapsulating composition to a SiNx substrate with a thickness of 50 μm and a coating area of 4 cm² (width: 2 cm, length: 2 cm) (spin coater), and then dried at room temperature for about 10 minutes or so under a nitrogen atmosphere, followed by UV curing through a light quantity of 4000 mJ/cm² with an intensity of 1000 mW/cm². After curing, the process of dropping the deionized water whose surface tension is known on the layer and obtaining the contact angle thereof is repeated five times to obtain an average value of the obtained five contact angle values, and in the same manner, the process of dropping the diiodomethane whose surface tension is known thereon and obtaining the contact angle thereof is repeated five times to obtain an average value of the obtained five contact angle values. Then, the surface energy was obtained by substituting the value (Strom value) regarding the solvent surface tension by the Owens-Wendt-Rabel-Kaelble method using the obtained average values of the contact angles for the deionized water and diiodomethane.

2. Measurement of Dielectric Constant

An Al plate (conductive plate) was deposited on the cleaned bare glass at 500 Å. The encapsulating compositions prepared in Examples and Comparative Examples were each inkjet-coated on the surface of the deposited Al plate, and the coated composition was subjected to curing with a light quantity of 1000 mJ/cm² through an LED UV lamp to form an organic layer with a thickness of 8 μm. The Al plate (conductive plate) was again deposited on the organic layer at 500 Å.

Then, the capacitance value of the Al plate was measured under conditions of 100 kHz and 25° C. using an impedence meter, Agilent 4194A. Through the measured value, the dielectric constant of the organic layer was calculated using the following equation.

$C = \varepsilon r \cdot \varepsilon o \cdot A/D$ ($C$: capacitance of Al plate, $\varepsilon r$: dielectric constant of organic layer, $\varepsilon o$: vacuum dielectric constant, $A$: area of Al plate, $D$: distance between two Al plates)

In the present application, the dielectric constant is a relative value (ratio) with respect to the dielectric constant in the vacuum when the dielectric constant in the vacuum has been set to 1.

3. Electrode Oxidation

A state where an Al electrode was deposited to a thickness of 500 μm on LCD glass was manufactured as a reference. Apart from the above, an Al electrode was deposited to a thickness of 500 μm on LCD glass, and the encapsulating compositions prepared in Examples and Comparative Examples were each inkjet-coated on the surface of the deposited Al electrode, and the coated composition was subjected to curing with a light quantity of 1000 mJ/cm² through an LED UV lamp to form an organic layer with a thickness of 8 μm. The Al electrode was again deposited to a thickness of 500 μm on the organic layer. By comparing the color change of the electrode with the naked eye and under a microscope as compared to the reference, the case where there was no color change and the case where the color was changed and the oxidation was observed were observed.

4. Step Difference

On the substrate that the uneven structure with a convex portion height of 2 μm, which was extended in one direction and formed, was patterned at intervals of 200 μm, the encapsulating compositions prepared in Examples and Comparative Examples were each subjected to inkjetting to a thickness of 10 μm and left for 5 minutes. Thereafter, the printed encapsulating composition was cured at a light quantity of 1000 mJ/cm² through an LED UV lamp to produce a sample that an organic layer was formed on the substrate. For the sample, the flatness of the organic layer surface was measured using a surface profiler (Alpha-Step, KLA-Tencor). As a result of the measurement, it was classified as good when the step difference in the surface of the organic layer was less than 0.5 μm, and it was classified as very good when it was less than 0.35 μm.

TABLE 1

|  |  | Surface energy | Dielectric constant | Electrode oxidation | Step difference |
|---|---|---|---|---|---|
| Example | 1 | 32 mN/m | 2.75 | No | 0.3 μm |
|  | 2 | 32 mN/m | 2.81 | No | 0.3 μm |

TABLE 1-continued

|  |  | Surface energy | Dielectric constant | Electrode oxidation | Step difference |
|---|---|---|---|---|---|
|  | 3 | 33 mN/m | 2.73 | No | 0.4 μm |
| Comparative Example | 1 | 33 mN/m | 3.47 | Oxidized | 0.3 μm |
|  | 2 | 29 mN/m | 3.52 | Oxidized | 0.1 μm |
|  | 3 | 30 mN/m | 3.10 | Oxidized | 0.5 μm |
|  | 4 | 31 mN/m | 2.85 | No | 0.5 μm |
|  | 5 | 32 mN/m | 3.10 | No | 0.6 μm |
|  | 6 | 30 mN/m | 3.32 | No | 0.7 μm |
|  | 7 | 31 mN/m | 2.72 | Oxidized | 0.2 μm |

The invention claimed is:

1. An encapsulating composition comprising:
a multifunctional monomer of Formula 1;
a multifunctional monomer of Formula 2; and
a monofunctional monomer,
wherein the multifunctional monomer of Formula 1 is comprised in the encapsulating composition in a range of 50 wt % or less:

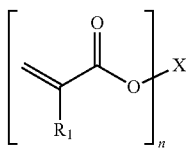

[Formula 1]

wherein, in Formula 1, $R_1$ is hydrogen or an alkyl group having 1 to 4 carbon atoms, n is a number of 2 to 10, and X represents a residue derived from a cyclic alkyl group having 6 to 30 carbon atoms, where X contains two or less oxygen atoms, and

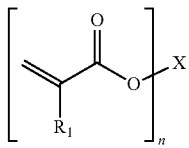

[Formula 2]

wherein, in Formula 2, $R_1$ is hydrogen or an alkyl group having 1 to 4 carbon atoms, n is a number of 2 to 10, and X represents a residue derived from a linear or branched alkyl group having 11 to 30 carbon atoms, excluding a cyclic structure, where X contains two or less oxygen atoms.

2. The encapsulating composition according to claim 1, wherein X in Formula 1 contains no oxygen atom.

3. The encapsulating composition according to claim 1, wherein X in Formula 1 has an alicyclic structure.

4. The encapsulating composition according to claim 1, wherein X in Formula 1 has a bicyclic or tricyclic structure.

5. The encapsulating composition according to claim 1, wherein X in Formula 2 represents a residue derived from a linear alkyl group having 12 to 30 carbon atoms.

6. The encapsulating composition according to claim 1, wherein X in Formula 2 contains no oxygen atom.

7. The encapsulating composition according to claim 1, wherein the multifunctional monomer of Formula 2 is comprised in a range of 50 to 140 parts by weight relative to 100 parts by weight of the multifunctional monomer of Formula 1.

8. The encapsulating composition according to claim 1, wherein the monofunctional monomer is comprised in a range of 80 to 230 parts by weight relative to 100 parts by weight of the multifunctional monomer of Formula 1.

9. The encapsulating composition according to claim 1, wherein the monofunctional monomer comprises an alkyl (meth)acrylate.

10. The encapsulating composition according to claim 1, wherein the monofunctional monomer comprises an alkyl (meth)acrylate containing a linear, branched or cyclic alkyl group having 8 to 30 carbon atoms.

11. The encapsulating composition according to claim 1, further comprising a crosslinking agent.

12. The encapsulating composition according to claim 11, wherein the crosslinking agent is comprised in a range of 10 to 70 parts by weight relative to 100 parts by weight of the multifunctional monomer of Formula 1.

13. The encapsulating composition according to claim 1, further comprising a photoinitiator.

14. The encapsulating composition according to claim 13, wherein the photoinitiator is a radical initiator.

15. The encapsulating composition according to claim 1, further comprising a surfactant.

16. The encapsulating composition according to claim 15, wherein the surfactant comprises a silicone-based compound.

17. The encapsulating composition according to claim 1, wherein the composition is an ink composition which is a solventless type.

18. An organic electronic device comprising;
a substrate;
an organic electronic element formed on the substrate; and
an organic layer encapsulating the entire surface of the organic electronic element,
wherein the organic layer comprises the encapsulating composition according to claim 1.

19. A method for manufacturing an organic electronic device, comprising a step of forming an organic layer on a substrate, on which an organic electronic element is formed, by applying the encapsulating composition of claim 1 so as to encapsulate the entire surface of the organic electronic element.

* * * * *